(12) United States Patent
Funabashi

(10) Patent No.: US 11,239,840 B2
(45) Date of Patent: Feb. 1, 2022

(54) SWITCHING CIRCUIT AND IMAGING DEVICE

(71) Applicant: Panasonic Intellectual Property Management Co., Ltd., Osaka (JP)

(72) Inventor: Masami Funabashi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/064,654

(22) Filed: Oct. 7, 2020

(65) Prior Publication Data

US 2021/0135670 A1 May 6, 2021

(30) Foreign Application Priority Data

Oct. 31, 2019 (JP) .............................. JP2019-198462

(51) Int. Cl.
*H03K 5/1252* (2006.01)
*H03K 17/16* (2006.01)
*H03K 17/687* (2006.01)
*H03K 17/693* (2006.01)
*H01L 27/146* (2006.01)
*H03K 17/10* (2006.01)

(52) U.S. Cl.
CPC ..... *H03K 17/693* (2013.01); *H01L 27/14612* (2013.01); *H03K 17/102* (2013.01)

(58) Field of Classification Search
None
See application file for complete search history.

(56) References Cited

U.S. PATENT DOCUMENTS

| | | | | |
|---|---|---|---|---|
| 5,350,957 A | * | 9/1994 | Cooper | H03K 17/6871 327/379 |
| 7,492,238 B2 | * | 2/2009 | Nakatsuka | H01P 1/15 333/101 |
| 7,915,946 B2 | * | 3/2011 | Takahashi | H03K 17/165 327/427 |
| 10,050,609 B2 | * | 8/2018 | Yoo | H03H 11/04 |
| 10,608,623 B2 | * | 3/2020 | Kerr | H03K 17/04106 |
| 2010/0245641 A1 | | 9/2010 | Takata | |

FOREIGN PATENT DOCUMENTS

| | | |
|---|---|---|
| JP | 5-258584 | 10/1993 |
| JP | 2010-041279 | 2/2010 |
| JP | 2010-233096 | 10/2010 |
| JP | 2013-207700 | 10/2013 |

* cited by examiner

*Primary Examiner* — Kenneth B Wells
(74) *Attorney, Agent, or Firm* — McDermott Will and Emery LLP

(57) ABSTRACT

A switching circuit includes a first input terminal, an output terminal, and a first circuit that switches between outputting and not outputting, to the output terminal, a first voltage that is inputted to the first input terminal. The first circuit includes a first transistor and a second transistor that are connected in series between the first input terminal and the output terminal and a first voltage-dividing circuit that divides the first voltage and supplies the first voltage thus divided to a common node between the first transistor and the second transistor.

21 Claims, 8 Drawing Sheets

FIG. 4

| SWITCHING CIRCUIT 200 | VOUT | FIRST CIRCUIT 110 | SECOND CIRCUIT 120 |
|---|---|---|---|
| STATE 1 | VIN1 | ON | OFF |
| STATE 2 | VIN2 | OFF | ON |
| STATE 3 | — | OFF | OFF |

SWITCHING CIRCUIT AND IMAGING DEVICE

BACKGROUND

1. Technical Field

The present disclosure relates to a switching circuit and an imaging device including a switching circuit and, in particular, to a switching circuit including a plurality of transistors connected in series.

2. Description of the Related Art

Conventionally, a circuit configuration in which multiple transistors are connected in series has been known as a switching circuit that handles a high voltage with low-withstand-voltage transistors.

For example, in Japanese Unexamined Patent Application Publication No. 2013-207700 (see FIG. 3), a switching circuit connected between two terminals between which there occurs a potential difference exceeding a transistor withstand voltage is configured such that three NMOS transistors are connected in series. Furthermore, the following voltages are inputted as gate voltages to these NMOS transistors. That is, two intermediate voltages are generated by resistance voltage division of a high voltage that is applied between a gate of a first NMOS transistor and a drain of a third NMOS transistor. A GND voltage Vg1, which is a first intermediate voltage, is inputted to the gate of the first NMOS transistor. An intermediate voltage Vg2, which is second highest after the GND voltage Vg1, is inputted to a gate of a second NMOS transistor. An intermediate voltage Vg3, which is third highest after the GND voltage Vg1, is inputted to a gate of the third NMOS transistor.

Improvement in reliability is required of a switching circuit including a plurality of transistors connected in series.

SUMMARY

One non-limiting and exemplary embodiment provides a highly-reliable switching circuit and an imaging device including such a switching circuit.

In one general aspect, the techniques disclosed here feature a switching circuit including: a first input terminal; an output terminal; and a first circuit that switches between outputting and not outputting, to the output terminal, a first voltage that is inputted to the first input terminal, wherein the first circuit includes a first transistor and a second transistor that are connected in series between the first input terminal and the output terminal, and a first voltage-dividing circuit that divides the first voltage and supplies the first voltage thus divided to a first node between the first transistor and the second transistor. In one general aspect, the techniques disclosed here feature an imaging device including: a semiconductor substrate; a pixel array including a plurality of pixels arrayed on the semiconductor substrate; and a switching circuit located on the semiconductor substrate, wherein each of the plurality of pixels includes a first electrode, a second electrode, and a photoelectric conversion layer sandwiched between the first electrode and the second electrode, the respective first electrodes of the plurality of pixels are electrically connected to one another, and the output terminal of the switching circuit is connected to the first electrode.

An embodiment of the present disclosure brings about improvement in reliability of a switching circuit including a plurality of transistors connected in series and an imaging device including such a switching circuit.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 4 is a diagram showing a table illustrating states of the switching circuit according to Embodiment 2;

DETAILED DESCRIPTION

Figure 1:
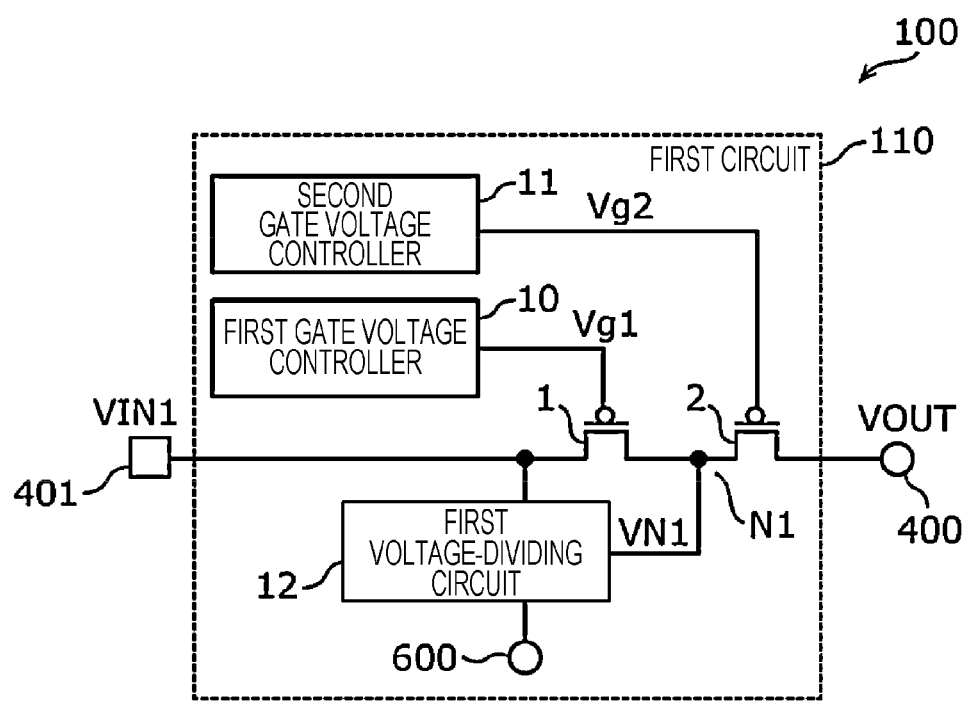
FIG. 1 is a diagram showing an example configuration of a switching circuit according to Embodiment 1.

Underlying Knowledge Forming Basis an Aspect of the Present Disclosure

In the switching circuit disclosed in Japanese Unexamined Patent Application Publication No. 2013-207700, the three transistors are connected in series, and to the gates of two of the three transistors, the voltages Vg2 and Vg3, which are obtained by resistance voltage division of a high voltage between a high-voltage-side node nd1 and a low-voltage-side node nd3, are applied, respectively. This switching circuit is configured to be brought into an on state when Voltage at node nd2=Voltage at node Nd1<0 (i.e. a negative potential) and to be brought into an off state when Voltage at node nd2<Voltage at node Nd1 or when Voltage at node nd2=Voltage at node Nd1=GND level. In this switching circuit, the three transistors are connected in series so as to be able to keep reliability without being broken even in a case where a voltage exceeding the withstand voltage of the transistors is applied to the node nd1. It should be noted that the withstand voltage is a maximum allowable voltage that can be applied to the transistors, and is also called "maximum voltage rating". Further, the simple term "transistors" refers to the transistors that constitute the switching circuit. Further, the "high voltage" as an input voltage is a term of relative expression and means a voltage exceeding the withstand voltage of the transistors.

However, in a case where the switching circuit is in an off state, a voltage at a source terminal of each transistor and a voltage at a drain terminal of each transistor converge to a certain value due to current leakage from the transistors or other reasons after resistance voltage division of a voltage at a gate of each transistor. The time the convergence takes and the value to which the voltages converge vary depending on the threshold voltage (Vth) of each transistor, a potential difference between the node nd1 and the node nd2, the size (gate width and gate length) of each transistor, a value of the current leakage, a power supply voltage, a junction temperature, or other factors. This makes it difficult to cause the switching circuit to perform an operation of frequently switching between on and off states while controlling interterminal voltages such as gate-source, gate-drain, drain-source, gate-substrate voltages so that the interterminal voltages are surely not higher than the withstand voltage.

Furthermore, when in an off state, the conventional switching circuit is based on the premise that the node nd1 and the node nd2 are at the same potential. Therefore, in a case where two or more switching circuit elements are used to construct a switching circuit including the same number of input terminals as the number of those switching circuit elements and one common output terminal, it is difficult to, in a state where either one of the switching circuit elements is in an on state and the other switching circuit element is in an off state so that there is a potential difference between the input terminal of the off-state switching circuit element and the common output terminal, maintain the switching circuit element in an off state while ensuring the reliability of transistors that constitute the off-state switching circuit element. The switching circuit is a whole circuit that has the function of a switch. The switching circuit element is an element that constitutes the switching circuit, and is a circuit that has the function of a switch. The switching circuit is constituted by one or more switching circuit elements.

To address this problem, the present disclosure has as an object to, in configuring a high-withstand-voltage switching circuit using low-withstand-voltage transistors, provide a switching circuit that is capable of shortening the time it takes to switch between on and off states and surely controlling the interterminal voltage of each transistor so that the interterminal voltage is surely not higher than the withstand voltage. Furthermore, the present disclosure has as an object to ensure the reliability of an off-state transistor in a switching circuit using two or more switching circuit elements and including the same number of input terminals as the number of those switching circuit elements and one common output terminal.

To attain the foregoing objects, an embodiment of the present disclosure applies a desired voltage generated by resistance voltage division to a drain voltage terminal of a first transistor (i.e. a source voltage terminal of a second transistor), thereby surely keeping the interterminal voltage of each transistor not higher than the withstand voltage and, at the same time, causing a drain voltage of the first transistor (i.e. a source voltage of the second transistor) to follow a response characteristic with which to control a gate voltage. This makes it possible to, in a switching circuit that turns on and off a high voltage using low-withstand-voltage transistors, switch between on and off states at a higher speed than the conventional technology while keeping the reliability of the low-withstand-voltage transistors.

Embodiments are described below with reference to the drawings. It should be noted that the embodiments to be described below each illustrate a specific example of the present disclosure. The numerical values, shapes, constituent elements, the locations in which the constituent elements are disposed, the forms in which the constituent elements are connected, and the operation timings, and the like, which will be described in the following embodiments, are not intended to limit the present disclosure. Further, the drawings are not necessarily strict illustrations. In the drawings, substantially the same components are given the same reference signs, and a repeated description may be omitted or simplified.

Embodiment 1

FIG. 1 is a diagram showing an example configuration of a switching circuit 100 according to Embodiment 1. In FIG. 1, the switching circuit 100 includes a first input terminal 401 to which a high voltage serving as an example of a first voltage is inputted, an output terminal 400 through which to output the high voltage inputted to the first input terminal 401, and a first circuit 110 serving as a switching circuit element that switches between outputting and not outputting, to the output terminal 400, the high voltage inputted to the first input terminal 401. The first circuit 110 includes a first transistor 1 and a second transistor 2 that are connected in series, a first gate voltage controller 10 that controls the turning on and turning off of the first transistor 1, a second gate voltage controller 11 that controls the turning on and turning off of the second transistor 2, and a first voltage-dividing circuit 12 that divides the high voltage inputted to the first input terminal 401. A voltage VN1 obtained by voltage division at the first voltage-dividing circuit 12 is supplied to a common node N1 serving as an example of a first node between the first transistor 1 and the second transistor 2. The first gate voltage controller 10 and the second gate voltage controller 11 do not necessarily need to be provided in the first circuit 110 but, for example, may be provided outside the switching circuit 100.

In Embodiment 1, the first transistor 1 and the second transistor 2 are both PMOS transistors. Further, in bringing the switching circuit 100 into an on state, the first gate voltage controller 10 and the second gate voltage controller 11 bring the first transistor 1 and the second transistor 2, respectively, into an on state; meanwhile, in bringing the switching circuit 100 into an off state, the first gate voltage controller 10 and the second gate voltage controller 11 bring the first transistor 1 and the second transistor 2, respectively, into an off state.

In the switching circuit 100 according to Embodiment 1, the first transistor 1 and the second transistor 2, which are two low-withstand-voltage transistors, are connected in series, whereby especially when the switching circuit 100 is in an off state, a terminal voltage between any two respective terminals (i.e. between a gate terminal and a source terminal, between the gate terminal and a drain terminal, between a drain terminal and the source terminal, between the gate terminal and a substrate terminal, between a source terminal and the substrate terminal, or between the drain terminal and the substrate terminal) of the first transistor 1 and the second transistor 2 so that the terminal voltage does not exceed the withstand voltage of the transistors. Since the output terminal 400 is in a float state when the switching circuit 100 is in an off state, another voltage may be applied to the output terminal 400 via another switching circuit.

Here are examples of gate voltages of the transistors and the voltage VN1 at the common node N1 between the two serially-connected transistors, namely the first transistor 1 and the second transistor 2, in a state where the transistors have a withstand voltage Vhv of 4 V, where a high voltage VIN1 of 7 V is inputted to the first input terminal 401, and where an output voltage VOUT of 0 V is applied to the output terminal 400 when the switching circuit 100 is in an off state.

The first gate voltage controller 10 applies a gate voltage Vg1 of 7 V to the gate of the first transistor 1. This causes the gate-source voltage of the first transistor 1 to be given as Vg1−VIN=0 V, bringing the first transistor 1 into an off state. The second gate voltage controller 11 applies, to the gate of the second transistor 2, a gate voltage Vg2 determined in the following manner. That is, the gate voltage Vg2 of the second transistor 2 is determined so as to satisfy (Vg2−VOUT)<4 V, which is a potential difference between the gate of the second transistor 2 and the output terminal 400, (Vg2−VN1)>Vth, and Vg1−VN1<4 V. For example, if Vg2=3.5 V and VN1=3.5 V, Vg1−VN1=3.5 V and Vg2−VN1=0 V; therefore, the aforementioned conditions can be satisfied. It should be noted that Vth is the threshold voltage of the first transistor 1 and the second transistor 2.

In the switching circuit 100 according to Embodiment 1, even if the output voltage VOUT changes from 7 V to 0 V when the switching circuit 100 is in an off state, a potential difference of 3.5 V or higher does not occur between any two respective terminals of the first transistor 1 and the second transistor 2 of the switching circuit 100, so that the reliability of the transistors can be ensured.

Figure 2:
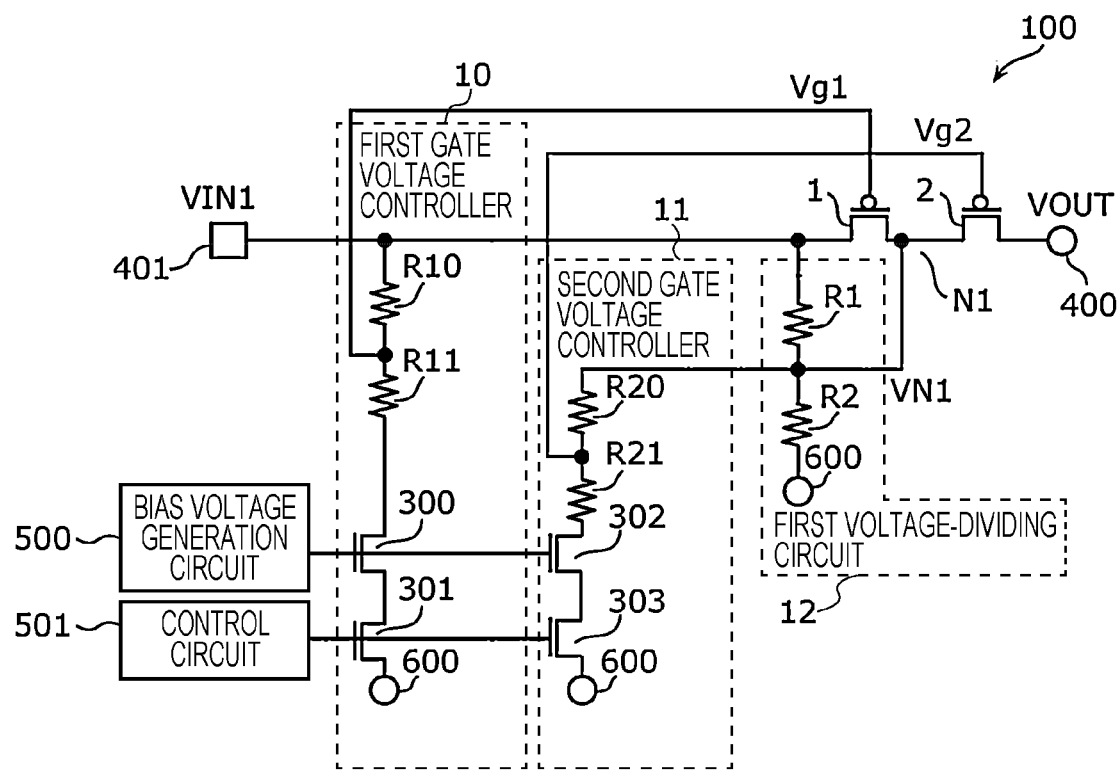
FIG. 2 is a diagram showing a specific circuit example of the switching circuit according to Embodiment 1.

FIG. 2 is a diagram showing a specific circuit example of the switching circuit 100 according to Embodiment 1. In this circuit example, the switching circuit 100 includes a bias voltage generation circuit 500 and a control circuit 501 in addition to the elements shown in FIG. 1. Note, however, that the bias voltage generation circuit 500 and the control circuit 501 do not necessarily need to be provided in the switching circuit 100 but may be provided outside the switching circuit 100.

The first gate voltage controller 10 outputs, as the gate voltage Vg1 to the gate of the first transistor 1, either a voltage obtained by dividing a voltage between the first input terminal 401 and a reference voltage terminal 600 or a high voltage inputted to the first input terminal 401. For that purpose, the first gate voltage controller 10 includes a control transistor 301 that controls whether to output a divided voltage obtained by dividing, by voltage-dividing resistors R10 and R11, the high voltage VIN1 that is inputted to the first input terminal 401 or output the high voltage that is inputted to the first input terminal 401. Since the high voltage VIN1 that is inputted to the first input terminal 401 exceeds the withstand voltage of the transistors used in the first gate voltage controller 10, such a configuration is adopted that a control transistor 300 is connected in series to the control transistor 301 and a potential difference between the respective terminals of the control transistors 300 and 301 does not exceed the withstand voltage of the transistors.

The control circuit 501 operates in reaction to the supply of a power supply voltage (e.g. 3.3 V) that is supplied to an SoC (system-on-a-chip) on which the switching circuit 100 is mounted. The bias voltage generation circuit 500 outputs the divided voltage (e.g. 4 V) obtained by resistance voltage division of the voltage between the first input terminal 401 and the reference voltage terminal 600. The reference voltage terminal 600 is maintained, for example, at the same potential as the ground potential of the SoC.

The second gate voltage controller 11 outputs, as the gate voltage Vg2 to the gate of the second transistor 2, either a voltage obtained by dividing a voltage between the common node N1 and the reference voltage terminal 600 or a voltage at the common node N1. For that purpose, the second gate voltage controller 11 includes a control transistor 303 that controls whether to output a divided voltage obtained by dividing the voltage VN1 at the common node N1 by voltage-dividing resistors R20 and R21 or output the voltage VN1 at the common node N1. Since the voltage VN1 at the common node N1 exceeds the withstand voltage of the transistors used in the second gate voltage controller 11, such a configuration is adopted that a control transistor 302 is connected in series to the control transistor 303 and a potential difference between the respective terminals of the control transistors 302 and 303 does not exceed the withstand voltage of the transistors.

The first voltage-dividing circuit 12 is connected between the first input terminal 401 and the reference voltage terminal 600, and is constituted by two voltage-dividing resistors R1 and R2 connected in series. The voltage-dividing resistors R1 and R2 are examples of a first resistor element and a second resistor element, respectively. A point of connection between the voltage-dividing resistors R1 and R2 is connected to the common node N1. The first voltage-dividing circuit 12 supplies the common node N1 between the first transistor 1 and the second transistor 2 with a divided voltage obtained by dividing, by the voltage-dividing resistors R1 and R2, the high voltage VIN1 inputted to the first input terminal 401.

Now, the following describes an operating state of the switching circuit 100, assuming High voltage inputted=7 V, SoC power supply voltage=3.3 V, Voltage at reference voltage terminal 600=SoC ground terminal=0 V, and Transistor withstand voltage=4 V.

In bringing the first transistor 1 and the second transistor 2 into an on state, the control circuit 501 outputs an H level (e.g. 3.3 V). As a result, the control transistors 301 and 303 are brought into an on state, and the voltage-dividing resistors R10 and R11 of the first gate voltage controller 10 and the voltage-dividing resistors R20 and R21 of the second gate voltage controller 11 become connected to the reference voltage terminal 600. Accordingly, the first gate voltage controller 10 outputs, as the gate voltage Vg1 to the gate of the first transistor 1, the divided voltage obtained by dividing, by the voltage-dividing resistors R10 and R11, the high voltage inputted to the first input terminal 401. As a result, the first transistor 1 is brought into an on state. At this point in time, Vg1=VIN1×{R11/(R10+R11)}. It should be noted that the voltage-dividing resistors R10 and R11 are set at such values of resistance that (Vg1−VIN1)<Vth and |Vg1−VIN1|<4 V. Similarly, the second gate voltage controller 11 outputs, as the gate voltage Vg2 to the gate of the second transistor 2, the divided voltage obtained by dividing the voltage VN1 at the common node N1 by the voltage-dividing resistors R20 and R21. As a result, the second transistor 2 is brought into an on state. At this point in time, Vg2=VN1×{R21/(R20+R21)}. It should be noted that the voltage-dividing resistors R20 and R21 are set at such values of resistance that (Vg2−VN1)<Vth and |Vg2−VN1|<4 V.

Further, setting the values of resistance of the voltage-dividing resistors R1 and R2 1000 or more times as high as the values of on resistance of the first transistor 1 and the second transistor 2 in advance causes the voltage at the common node N1 (VN1) to become substantially equal to the high voltage VIN1 at the first input terminal 401 when the first transistor 1 is in an on state.

Meanwhile, in bringing the first transistor 1 and the second transistor 2 into an off state, the control circuit 501 outputs an L level, i.e. the same voltage (e.g. the ground voltage of 0 V of the SoC) as the voltage at the reference voltage terminal 600. As a result, the control transistors 301 and 303 are brought into an off state, and the voltage-dividing resistors R10 and R11 of the first gate voltage controller 10 and the voltage-dividing resistors R20 and R21 of the second gate voltage controller 11 are not connected to the reference voltage terminal 600. Accordingly, the first gate voltage controller 10 outputs, as the gate voltage Vg1 to the gate of the first transistor 1, a voltage that is at the same potential as the high voltage VIN1 inputted to the first input terminal 401. As a result, the first transistor 1 is brought into an off state.

The first voltage-dividing circuit 12 is always connected between the first input terminal 401 and the reference voltage terminal 600 regardless of an output state of the control circuit 501, and when the first transistor 1 is in an off state, the divided voltage VN1 based on the voltage-dividing resistors R1 and R2 is a voltage obtained by dividing the voltage between the first input terminal 401 and the reference voltage terminal 600 by the voltage-dividing resistors R1 and R2. The second gate voltage controller 11 is connected between an output terminal (i.e. the common node N1) of the first voltage-dividing circuit 12 and the reference voltage terminal 600, and when the control transistor 303 is in an off state, the second gate voltage controller 11 outputs VN1=VIN1×{R2/(R1+R2)} as the gate voltage Vg2 to the gate of the second transistor 2. That is, Output voltage Vg2 of second gate voltage controller 11=VN1. Therefore, the voltage at the source terminal of second transistor 2 (i.e. Voltage VN1 at common node N1)−Gate voltage (Vg2 voltage) of second transistor 2≈0 V, whereby the second transistor 2 is brought into an off state. In the off state of the second transistor 2, the values of resistance of the voltage-dividing resistors R1 and R2 are set so that |VN1−VOUT|<4 V.

As described above, the switching circuit 100 according to Embodiment 1 makes it possible to, by using the first voltage-dividing circuit 12, cause the voltage at the common node N1 between the first transistor 1 and the second transistor 2 to accurately and quickly converge to a desired voltage. The switching circuit 100 according to Embodiment 1 also makes it possible to, without being influenced by variations in Vth of the transistors caused by temperature change and production tolerance, exercise control so that the withstand voltage of the transistors is surely not exceeded.

As noted above, a switching circuit 100 according to Embodiment 1 includes a first input terminal 401, an output terminal 400, and a first circuit 110 that switches between outputting and not outputting, to the output terminal 400, a first voltage that is inputted to the first input terminal 401. The first circuit 110 includes a first transistor 1 and a second transistor 2 that are connected in series between the first input terminal 401 and the output terminal 400 and a first voltage-dividing circuit 12 that divides the first voltage and supplies the first voltage thus divided to a common node N1 between the first transistor 1 and the second transistor 2.

This causes the common node N1 between the first transistor 1 and the second transistor 2 to be supplied by the first voltage-dividing circuit 12 with a divided voltage obtained by dividing the first voltage that is inputted to the first input terminal 401. This makes it possible to cause the voltage at the common node N1 between the first transistor 1 and the second transistor 2 to accurately and quickly converge to the desired voltage unlike in the case of the conventional technology with which to divide a power supply voltage. This also makes it possible to, without being influenced by variations in Vth of the transistors caused by temperature change and production tolerance, exercise control so that the withstand voltage of the transistors is surely not exceeded. This results in improvement in reliability of a switching circuit including a plurality of transistors connected in series.

Further, the first voltage-dividing circuit 12 includes a first resistor element (R1) and a second resistor element (R2) that are connected in series between the first input terminal 401 and a reference voltage, and a point of connection between the first resistor element (R1) and the second resistor element (R2) is connected to the common node N1. This makes it possible to, by way of simple resistance voltage division, cause the voltage at the common node N1 to accurately and quickly converge to the desired voltage.

Embodiment 2

Figure 3:
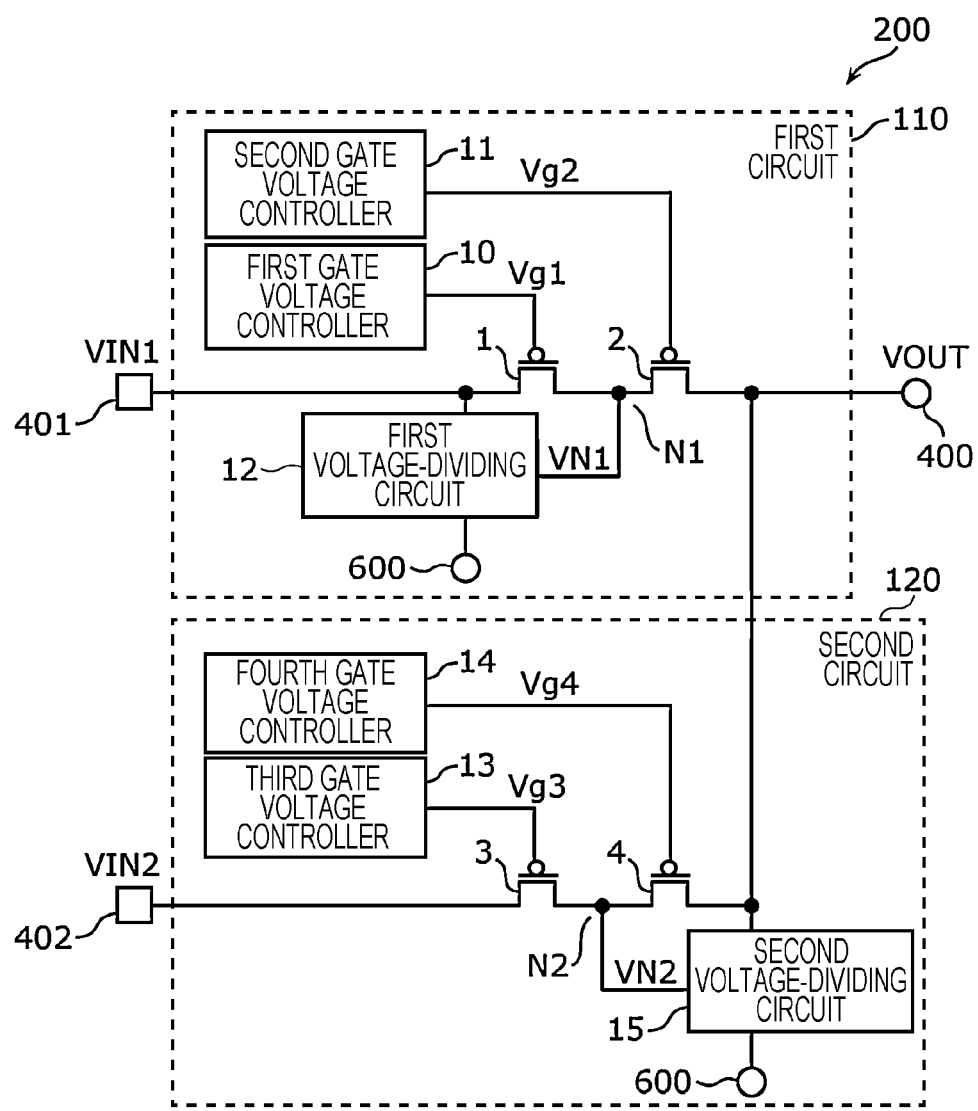
FIG. 3 is a diagram showing an example configuration of a switching circuit according to Embodiment 2.

FIG. 3 is a diagram showing an example configuration of a switching circuit 200 according to Embodiment 2. In FIG. 3, the switching circuit 200 includes a first input terminal 401 to which a high voltage serving as an example of a first voltage is inputted, a second input terminal 402 to which a low voltage serving as an example of a second voltage is inputted, an output terminal 400 through which to selectively output the high voltage inputted to the first input terminal 401 or the low voltage inputted to the second input terminal 402, a first circuit 110 serving as a switching circuit element to which the high voltage, which is an example of the first voltage, is inputted and that controls tuning on and turning off as to whether to output the high voltage thus inputted or not, and a second circuit 120 serving as a switching circuit element to which the low voltage, which is an example of the second voltage, is inputted and that controls tuning on and turning off as to whether to output the low voltage thus inputted or not. Embodiment 2 assumes that the low voltage that is inputted to the second input terminal 402 does not exceed the withstand voltage of a third transistor 3 or a fourth transistor 4. Constituent elements which are the same as those of Embodiment 1 are given the same reference signs, and a description of such constituent elements is omitted.

The second circuit 120 includes the third transistor 3 and the fourth transistor 4, which are connected in series, a third gate voltage controller 13 that controls the turning on and turning off of the third transistor 3, a fourth gate voltage controller 14 that controls the turning on and turning off of the fourth transistor 4, and a second voltage-dividing circuit 15 that divides a voltage at the output terminal 400. A voltage obtained by voltage division at the second voltage-dividing circuit 15 is supplied to a common node N2 serving as an example of a second node between the third transistor 3 and the fourth transistor 4. The third gate voltage controller 13 and the fourth gate voltage controller 14 do not necessarily need to be provided in the second circuit 120 but, for example, may be provided outside the switching circuit 200.

FIG. 4 is a diagram showing a table illustrating states of the switching circuit 200 of FIG. 3. FIG. 4 shows the output voltage VOUT of the switching circuit 200, the on or off state of the first circuit 110, and the on or off state of the second circuit 120 in each of the three states (namely "STATE 1", "STATE 2", and "STATE 3"). In "STATE 3", the output terminal 400 of the switching circuit 200 is in a float state, and the output voltage VOUT of the switching circuit 200 is indefinite ("-" in FIG. 4).

Figure 5:
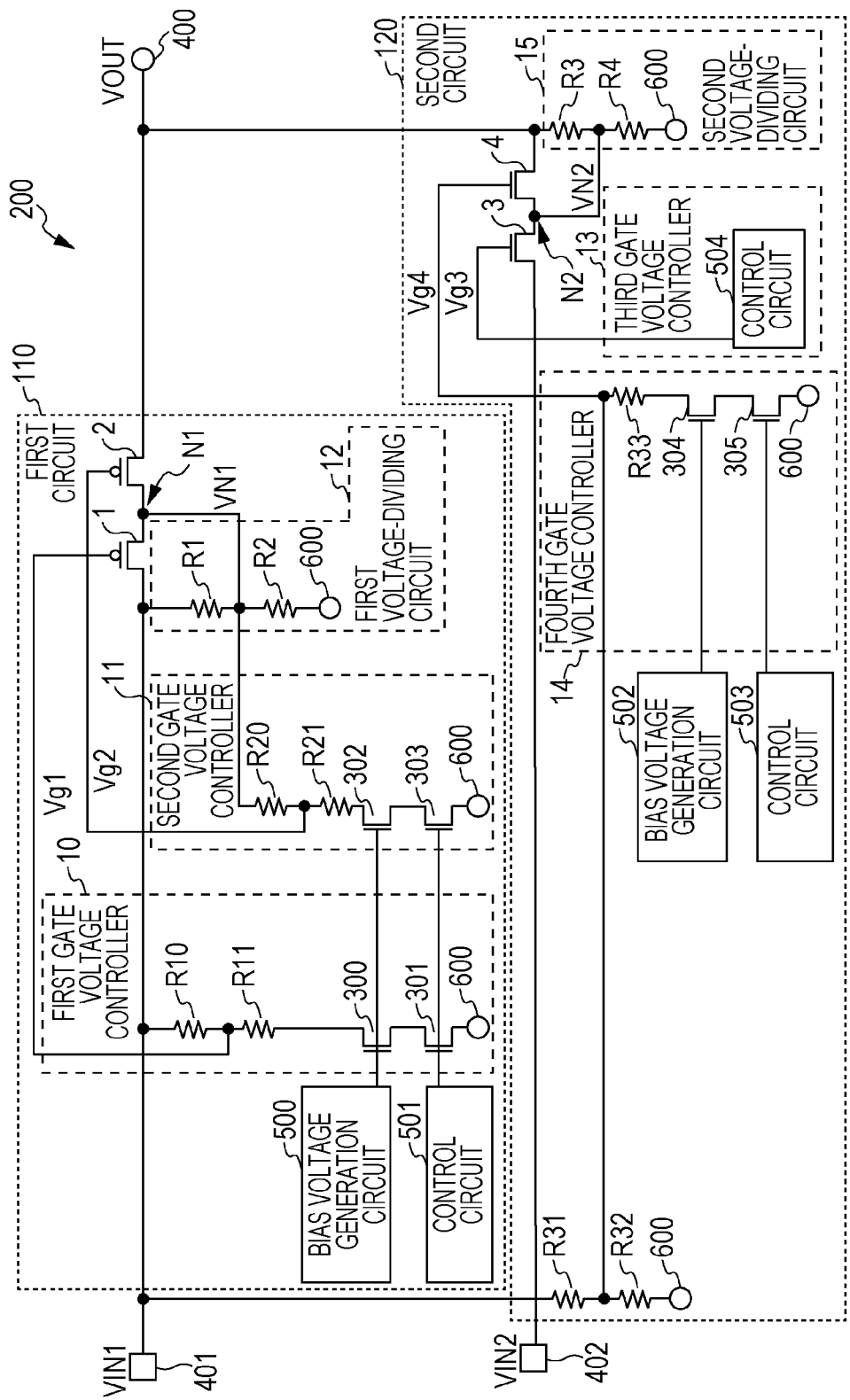
FIG. 5 is a diagram showing a specific circuit example of the switching circuit according to Embodiment 2.

FIG. 5 is a diagram showing a specific circuit example of the switching circuit 200 according to Embodiment 2.

In the switching circuit 200, the first circuit 110 is the same in configuration as the circuit illustrated in FIG. 2. In the switching circuit 200, the second circuit 120 includes a bias voltage generation circuit 502, a control circuit 503, and voltage-dividing resistors R31 and R32 in addition to the elements shown in FIG. 3. Note, however, that the bias voltage generation circuit 502, the control circuit 503, and the voltage-dividing resistors R31 and R32 do not necessarily need to be provided in the switching circuit 200 but may be provided outside the switching circuit 200.

The second circuit 120 has an input terminal connected to the second input terminal 402, to which a low voltage (i.e. a voltage not exceeding a transistor withstand voltage) is inputted, and has an output terminal connected to the same node as the output terminal 400 of the first circuit 110.

The third gate voltage controller 13 includes a control circuit 504 that outputs a gate voltage Vg3 to a gate of the third transistor 3 in reaction to the supply of a power supply voltage (e.g. 3.3 V) of an SoC. The fourth gate voltage controller 14 outputs, as a gate voltage Vg4 to a gate of the fourth transistor 4, a voltage obtained by dividing a voltage between the first input terminal 401 and a reference voltage terminal 600.

The second voltage-dividing circuit 15 is connected between the output terminal 400 and the reference voltage terminal 600, and is constituted by two voltage-dividing resistors R3 and R4 connected in series. The voltage-dividing resistors R3 and R4 are examples of a third resistor element and a fourth resistor element, respectively. A point of connection between the voltage-dividing resistors R3 and R4 is connected to the common node N2. The second voltage-dividing circuit 15 divides a voltage between the output terminal 400 and the reference voltage terminal 600 by the voltage-dividing resistors R3 and R4 and supplies a divided voltage VN2 thus obtained to the common node N2 between the third transistor 3 and the fourth transistor 4.

As shown in FIG. 4, the switching circuit 200 can assume any of the three states, depending on a combination of the on and off states of the first circuit 110 and the second circuit 120. The following describes a circuit operation in each of the three states 1 to 3 shown in FIG. 4, assuming High voltage VIN 1 inputted to first input terminal 401=7 V, Low voltage VIN2 inputted to second input terminal 402=0.5 V, SoC power supply voltage=3.3 V, Voltage at reference voltage terminal 600=SoC ground terminal=0 V, and Transistor withstand voltage=4 V.

In STATE 1 shown in FIG. 4, the first circuit 110 is in an on state (that is, the first transistor 1 and the second transistor 2 are in an on state), and the second circuit 120 is in an off state (that is, the third transistor 3 and the fourth transistor 4 are in an off state).

Since the on state of the first transistor 1 and the second transistor 2 is the same as the on state of the first transistor 1 and the second transistor 2 of the switching circuit 100 of FIG. 2, a detailed description of an operation in such an on state is omitted.

In order to bring the third transistor 3 and the fourth transistor 4 into an off state, the control circuits 503 and 504 output the same voltage (e.g. the ground voltage 0 V of the SoC) as the reference voltage terminal 600. In a case where a voltage that is inputted to the third transistor 3 is not higher than the withstand voltage, control may be exercised at the same potential as the power supply voltage of the SoC. Since the control circuit 504 outputs the same voltage as the reference voltage terminal 600 to the gate of the third transistor 3, (Vg3−VIN2)<Vth, whereby the third transistor 3 is brought into an off state. In Embodiment 2, Vth is the threshold voltage of the third transistor 3 and the fourth transistor 4.

Next, an output voltage of the fourth gate voltage controller 14 (i.e. the gate voltage Vg4 of the fourth transistor 4) is described. When the first circuit 110 is in an on state, Output voltage VOUT=VIN1, whereby the high voltage VIN1 inputted to the first input terminal 401 is outputted as the output voltage VOUT; therefore, the off state of the fourth transistor 4 must be retained with the high voltage VIN1 applied to a drain terminal of the fourth transistor 4. To this end, the fourth gate voltage controller 14 generates the gate voltage Vg4 using the high voltage VIN1 inputted to the first input terminal 401. Specifically, since the control transistor 305 is brought into an off state, the fourth gate voltage controller 14 outputs a voltage obtained by dividing, by the voltage-dividing resistors R31 and R32, the high voltage VIN1 inputted to the first input terminal 401. At this point in time, VIN2, Vg3, Vg4, the voltage VN2 at the common node N2, and VOUT must satisfy the relationships "|VOUT−Vg4|<4 V", "(Vg4−VN2)<Vth", "|VOUT−VN2|<4 V", |VN2−Vg3|<4 V", and "VN2−VIN21<4 V", respectively. It should be noted that the voltages VN2 and Vg4 can be calculated as VN2=VOUT×{R4/(R3+R4)} and Vg4=VIN1×{R32/(R31+R32)}, respectively. For example, designing so that VN2=3.0 V and Vg4=3.0 V makes it possible to satisfy the aforementioned five relational expressions and bring the fourth transistor 4 into an off state. By thus generating the gate voltage Vg4 of the fourth transistor 4 and the voltage VN2 at the common node N2 between the third transistor 3 and the fourth transistor 4 from the high voltage VIN1 inputted to the first input terminal 401 and the output voltage VOUT, respectively, reliable control can be exercised so that the withstand voltage of a transistor connected at a boundary between a high voltage and a low voltage is not exceeded. This makes it possible to secure the reliability of a switching circuit.

In STATE 2 shown in FIG. 4, the first circuit 110 is in an off state (that is, the first transistor 1 and the second transistor 2 are in an off state), and the second circuit 120 is in an on state (that is, the third transistor 3 and the fourth transistor 4 are in an on state).

Since the off state of the first transistor 1 and the second transistor 2 is the same as the off state of the first transistor 1 and the second transistor 2 of the switching circuit 100 of FIG. 2, a detailed description of an operation in such an off state is omitted.

In order to bring the third transistor 3 and the fourth transistor 4 into an on state, the control circuits 503 and 504 output an H level, i.e. the same voltage (e.g. 3.3 V) as the SoC power supply voltage. This results in (Vg3−VIN2)>Vth, whereby the third transistor 3 is brought into an on state.

Next, an output voltage of the fourth gate voltage controller 14 (i.e. the gate voltage Vg4 of the fourth transistor 4) is described. Since the control transistor 305 is brought into an on state, the fourth gate voltage controller 14 outputs Vg4=VIN1×{(R32//R33)/{R31+(R32//R33)}} (where R32//R33=R32×R33/(R32+R33)) as the gate voltage Vg4 to the gate of the fourth transistor 4. At this point in time, if (Vg4−VIN2)>Vth and |Vg4−VIN2|<4 V, the fourth transistor 4 is brought into an on state, whereby Output voltage VOUT=VIN 2. It should be noted that setting the values of resistance of the voltage-dividing resistors R3 and R4 of the second voltage-dividing circuit 15 1000 or more times as high as the values of on resistance of the third transistor 3 and the fourth transistor 4 in advance causes the voltage VN2 at the common node N2 to become substantially equal to the voltage at the second input terminal 402 when the fourth transistor 4 is in an on state.

In STATE 3 shown in FIG. 4, the first circuit 110 is in an off state (that is, the first transistor 1 and the second transistor 2 are in an off state), and the second circuit 120 is in an off state (that is, the third transistor 3 and the fourth transistor 4 are in an off state). In this STATE 3, the output terminal 400 of the switching circuit 200 is in a float state.

Details of the off state of the first circuit 110 are the same as those of the off state of the first transistor 1 and the second transistor 2 of the switching circuit 100 of FIG. 2. Meanwhile, details of the off state of the second circuit 120 are the same as those of the off state of the second circuit 120 in STATE 1 of the switching circuit 200 (i.e. the off state of the third transistor 3 and the fourth transistor 4). Therefore, a detailed description of operation of the first circuit 110 and the second circuit 120 is omitted.

As described above, the switching circuit 200 according to Embodiment 2 makes it possible to, even in a case where a switching circuit is constructed that outputs a high voltage and a low voltage through the same terminal, cause the voltage at the common node N1 between the first transistor 1 and the second transistor 2 and the voltage at the common node N2 between the third transistor 3 and the fourth transistor 4 to accurately and quickly converge to a desired voltage when the switching circuit elements are in an off state. The switching circuit 200 according to Embodiment 2 also makes it possible to, without being influenced by variations in Vth of the transistors caused by temperature change and production tolerance, exercise control so that the withstand voltage of the transistors is surely not exceeded. This makes it possible to, while satisfying the reliability of the transistors, provide a switching circuit that is capable of switching between a high voltage and a low voltage.

As noted above, a switching circuit 200 according to Embodiment 2, as compared with the switching circuit 100 according to Embodiment 1, further includes a second input terminal 402 and a second circuit 120 that switches between outputting or not outputting, to the output terminal 400, a second voltage that is inputted to the second input terminal 402, and the second circuit 120 includes a third transistor 3 and a fourth transistor 4 that are connected in series between the second input terminal 402 and the output terminal 400 and a second voltage-dividing circuit 15 that divides a voltage at the output terminal 400 and supplies the voltage thus divided to a common node N2 between the third transistor 3 and the fourth transistor 4.

This makes it possible to selectively output, through the output terminal 400, the first voltage inputted to the first input terminal 401 or the second voltage inputted to the second input terminal 402. Further, the common node N2 between the third transistor 3 and the fourth transistor 4 is supplied by the second voltage-dividing circuit 15 with a divided voltage obtained by dividing the voltage at the output terminal 400. This makes it possible to cause the voltage at the common node N2 between the third transistor 3 and the fourth transistor 4 to accurately and quickly converge to the desired voltage unlike in the case of the conventional technology with which to divide a power supply voltage. This also makes it possible to, without being influenced by variations in Vth of the transistors caused by temperature change and production tolerance, exercise control so that the withstand voltage of the transistors is surely not exceeded. This results in the realization of a more highly-reliable switching circuit that includes a plurality of switching circuit elements and selectively outputs any of two or more types of input voltage.

Further, the second voltage-dividing circuit 15 includes a third resistor element (R3) and a fourth resistor element (R4) that are connected in series between the output terminal 400 and a reference voltage, and a point of connection between the third resistor element (R3) and the fourth resistor element (R4) is connected to the common node N2. This makes it possible to, by way of simple resistance voltage division, cause the voltage at the common node N2 to accurately and quickly converge to the desired voltage.

Further, a high voltage exceeding at least one of a maximum voltage rating of the first transistor 1 and a maximum voltage rating of the second transistor 2 is inputted to the first input terminal 401, a low voltage not exceeding either a maximum voltage rating of the third transistor 3 or a maximum voltage rating of the fourth transistor 4 is inputted to the second input terminal 402, and the output terminal 400 selectively outputs the high voltage inputted to the first input terminal 401 or the low voltage inputted to the second input voltage 402.

As a result of this, although a high voltage exceeding the maximum voltage rating of a transistor is inputted, a potential difference between any two terminals of the transistors is not higher than the maximum voltage ratings, whereby a switching circuit is achieved that selectively outputs the high voltage inputted to the first input terminal 401 or the low voltage inputted to the second input terminal 402.

Embodiment 3

Figure 6:
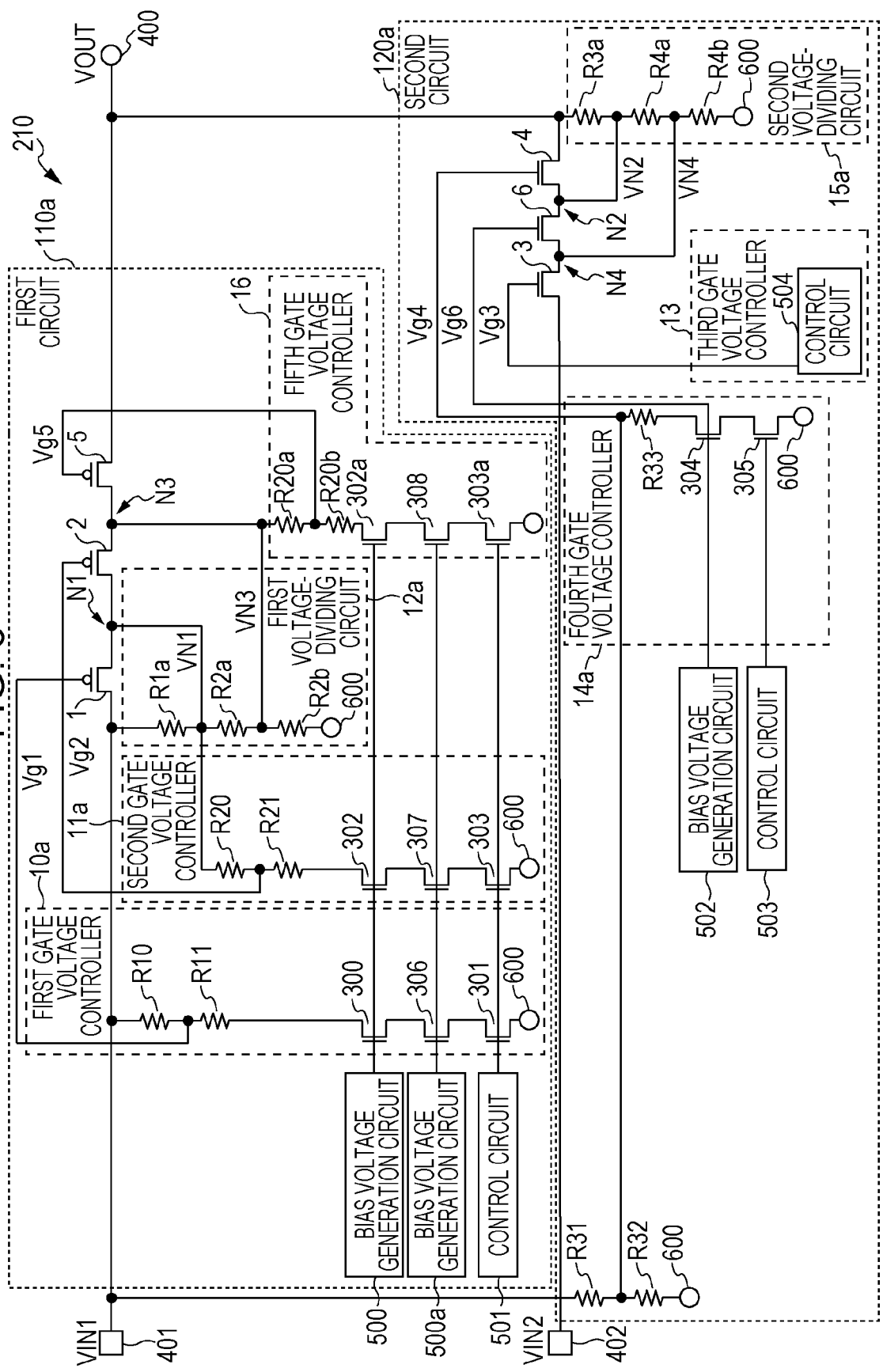
FIG. 6 is a diagram showing a specific circuit example of a switching circuit according to Embodiment 3.

FIG. 6 is a diagram showing a specific circuit example of a switching circuit 210 according to Embodiment 3. This switching circuit 210 is equivalent to a modification of the switching circuit 200 according to Embodiment 2 shown in FIG. 5. More particularly, the switching circuit 210 is configured by replacing two serially-connected transistors (i.e. the first transistor 1 and the second transistor 2) with three serially-connected transistors and replacing two serially-connected transistors (i.e. the third transistor 3 and the fourth transistor 4) with three serially-connected transistors in the switching circuit 200.

Specifically, the switching circuit 210 includes a first input terminal 401 to which a high voltage is inputted, a second input terminal 402 to which a low voltage is inputted, an output terminal 400 through which to output the high voltage inputted to the first input terminal 401 or the low voltage inputted to the second input terminal 402, a first circuit 110a serving as a switching circuit element to which the the high voltage is inputted and that controls turning on and turning off as to whether to output the high voltage thus inputted or not, and a second circuit 120a serving as a switching circuit element to which the low voltage is inputted and that controls tuning on and turning off as to whether to output the low voltage thus inputted or not. Constituent elements which are the same as those of Embodiment 2 are given the same reference signs, and a description of such constituent elements is omitted.

The first circuit 110a includes a first transistor 1, a second transistor 2, and a fifth transistor 5 that are connected in series, a first gate voltage controller 10a that controls the turning on and turning off of the first transistor 1, a second gate voltage controller 11a that controls the turning on and turning off of the second transistor 2, a fifth gate voltage controller 16 that controls the turning on and turning off of the fifth transistor 5, a first voltage-dividing circuit 12a that divides the voltage inputted to the first input terminal 401 and supplies two types of divided voltages thus obtained to a common node N3 serving as an example of a third node between the second transistor 2 and the fifth transistor 5 and the common node N1, respectively, bias voltage generation circuits 500 and 500a, and a control circuit 501.

The first circuit 110a according to Embodiment 3 is configured by adding the fifth transistor 5 subsequent to the first transistor 1 and the second transistor 2 of the first circuit 110 according to Embodiment 2. Alternatively, the fifth transistor 5 may be connected prior to or between the first transistor 1 and the second transistor 2. That is, unlike in the case of Embodiment 2 where two transistors are connected in series, the first circuit 110a according to Embodiment 3 is configured such that three transistors are connected in series.

In Embodiment 3, as is the case with the first transistor 1 and the second transistor 2, the fifth transistor 5 is a PMOS transistor.

The bias voltage generation circuit 500 outputs a divided voltage (e.g. a divided voltage of ⅔ of a high voltage) obtained by resistance voltage division of a voltage between the first input terminal 401 and a reference voltage terminal 600. The bias voltage generation circuit 500a outputs a divided voltage (e.g. a divided voltage of ⅓ of the high voltage) obtained by resistance voltage division of the voltage between the first input terminal 401 and the reference voltage terminal 600.

The first gate voltage controller 10a is a circuit that controls the turning on and turning off of the first transistor 1, and is configured by replacing the two serially-connected control transistors 300 and 301 with three serially-connected control transistors 300, 306, and 301 in the first gate voltage controller 10 according to Embodiment 2.

The second gate voltage controller 11a is a circuit that controls the turning on and turning off of the second transistor 2, and is configured by replacing the two serially-connected control transistors 302 and 303 with three serially-connected control transistors 302, 307, and 303 in the second gate voltage controller 11 according to Embodiment 2.

The fifth gate voltage controller 16 is basically the same in configuration as the second gate voltage controller 11a. That is, the fifth gate voltage controller 16 is connected between the common node N3 and the reference voltage terminal 600, and is constituted by voltage-dividing resistors R20a and R20b and control transistors 302a, 308, and 303a that are connected in series.

The first voltage-dividing circuit 12a is connected between the first input terminal 401 and the reference voltage terminal 600, and is constituted by three voltage-dividing resistors R1a, R2a, and R2b connected in series. A point of connection between the voltage-dividing resistors R1a and R2a is connected to the common node N1 and an end of the second gate voltage controller 11a (i.e. an end of the voltage-dividing resistor R20). Further, a point of connection between the voltage-dividing resistors R2a and R2b is connected to the common node N3 and an end of the fifth gate voltage controller 16 (i.e. an end of the voltage-dividing resistor R20a).

The second circuit 120a includes a third transistor 3, a sixth transistor 6, and a fourth transistor 4 that are connected in series, a third gate voltage controller 13 that controls the turning on and turning off of the third transistor 3, a fourth gate voltage controller 14a that controls the turning on and turning off of the sixth transistor 6 and the fourth transistor 4, a second voltage-dividing circuit 15a that divides the voltage outputted to the output terminal 400 and supplies two types of divided voltages thus obtained to a common node N4 serving as an example of a fourth node between the third transistor 3 and the sixth transistor 6 and the common node N2, respectively, a bias voltage generation circuit 502, and a control circuit 503.

The second circuit 120a according to Embodiment 3 is configured by adding the sixth transistor 6 between the third transistor 3 and the fourth transistor 4 of the second circuit 120 according to Embodiment 2. Alternatively, the sixth transistor 6 may be connected prior to or subsequent to the third transistor 3 and the fourth transistor 4. That is, unlike in the case of Embodiment 2 where two transistors are connected in series, the second circuit 120a according to Embodiment 3 is configured such that three transistors are connected in series.

In Embodiment 3, as is the case with the third transistor 3 and the fourth transistor 4, the sixth transistor 6 is an NMOS transistor.

The fourth gate voltage controller 14a is a circuit that controls the turning on and turning off of the fourth transistor 4 and the sixth transistor 6, and is basically the same in configuration as the fourth gate voltage controller 14 according to Embodiment 2. Note, however, that the fourth gate voltage controller 14a has, in addition to the function of the fourth gate voltage controller 14 according to Embodiment 2, a function of applying, as a gate voltage Vg6 directly to a gate of the sixth transistor 6, a voltage applied to a gate of the control transistor 304. In Embodiment 3, since the gate voltage Vg6 may happen to be the same voltage regardless of whether the second circuit 120a is on or off and is the same voltage as a bias voltage that is applied to the gate of the control transistor 304, the voltage that is applied to the gate of the control transistor 304 is directly applied as the gate voltage Vg6 to the gate of the sixth transistor 6. However, in a case where the number of transistors that are connected in series in the second circuit 120a is not three as in the case of Embodiment 3 but four or five or the high voltage VIN1 and the low voltage VIN2 are different from those of Embodiment 3, the voltage that is applied to the gate of the control transistor 304 is not always directly applied as the gate voltage Vg6 to the gate of the sixth transistor 6. In such a case, there is provided a gate controller that outputs, as a gate voltage, a proper voltage needed to turn on or off each transistor connected in series.

The second voltage-dividing circuit 15a is connected between the output terminal 400 and the reference voltage terminal 600, and is constituted by three voltage-dividing resistors R3a, R4a, and R4b connected in series. A point of connection between the voltage-dividing resistors R3a and R4a is connected to the common node N2, and a point of connection between the voltage-dividing resistors R4a and R4b is connected to the common node N4.

The switching circuit 210 according to Embodiment 3 thus configured operates in the following manner. The switching circuit 210 according to Embodiment 3 assumes a state which is similar to that of Embodiment 2 shown in FIG. 4. That is, when the first circuit 110a is in an on state and the second circuit 120a is in an off state, the switching circuit 210 assumes STATE 1 to output, through the output terminal 400, the high voltage inputted to the first input terminal 401. Meanwhile, when the first circuit 110a is in an off state and the second circuit 120a is in an on state, the switching circuit 210 assumes STATE 2 to output, through the output terminal 400, the low voltage inputted to the second input terminal 402. Furthermore, when the first circuit 110a is in an off state and the second circuit 120a is in an off state, the switching circuit 210 assumes STATE 3 to bring the output terminal 400 into a float state.

In the first circuit 110a, as in the case of Embodiment 2, the control circuit 501 outputs an H level in bringing the first circuit 110a into an on state, and the control circuit 501 outputs an L level in bringing the first circuit 110a into an off state. When the first circuit 110a is in an off state, i.e. in a case where the withstand voltage of the transistors may pose a problem, the voltages at the terminals of the transistors that constitute the first circuit 110 are as follows.

That is, the high voltage (e.g. 7.5 V) inputted to the first input terminal 401 is applied to a source of the first transistor 1, the gate voltage Vg1 (e.g. 7.5 V) is applied from the first gate voltage controller 10*a* to the gate of the first transistor 1, and the divided voltage VN1 (e.g. 5 V) is applied from the first voltage-dividing circuit 12*a* to a drain of the first transistor 1. As a result, the first transistor 1 is maintained in an off state and a potential difference between any terminals does not exceed the withstand voltage (e.g. 3 V).

Further, the divided voltage VN1 (e.g. 5 V) from the first voltage-dividing circuit 12*a* is applied to a source of the second transistor 2, the gate voltage Vg2 (e.g. 5 V) is applied from the second gate voltage controller 11*a* to the gate of the second transistor 2, and a divided voltage VN3 (e.g. 2.5 V) is applied from the first voltage-dividing circuit 12*a* to a drain of the second transistor 2. As a result, the second transistor 2 is maintained in an off state and a potential difference between any terminals does not exceed the withstand voltage (e.g. 3 V).

Further, the divided voltage VN3 (e.g. 2.5 V) is applied from the first voltage-dividing circuit 12*a* to a source of the fifth transistor 5, a gate voltage Vg5 (e.g. 2.5 V) is applied from the fifth gate voltage controller 16 to a gate of the fifth transistor 5, and a drain of the fifth transistor 5 is brought into a float state or the output voltage (e.g. 0.5 V) of the second circuit 120*a* is applied to the drain of the fifth transistor 5. As a result, the fifth transistor 5 is maintained in an off state and a potential difference between any terminals does not exceed the withstand voltage (e.g. 3 V).

The three control transistors by which the first gate voltage controller 10*a*, the second gate voltage controller 11*a*, and the fifth gate voltage controller 16 are each constituted are configured to be connected in series between the high voltage (e.g. 7.5 V) inputted to the first input terminal 401 and the reference voltage terminal 600, therefore, a potential difference between any terminals of each control transistor does not exceed the withstand voltage (e.g. 3 V).

In the second circuit 120*a*, as in the case of Embodiment 2, the control circuits 503 and 504 output an H level in bringing the second circuit 120*a* into an on state, and the control circuits 503 and 504 output an L level in bringing the second circuit 120*a* into an off state. When the second circuit 120*a* is in an off state, i.e. in a case where the withstand voltage of the transistors may pose a problem, and the first circuit 110*a* is in an on state, the voltages at the terminals of the transistors that constitute the second circuit 120*a* are as follows.

That is, the voltage (e.g. 7.5 V) at the output terminal 400 is applied to a drain of the fourth transistor 4, the gate voltage Vg4 (e.g. 5 V) is applied from the fourth gate voltage controller 14*a* to the gate of the fourth transistor 4, and the divided voltage VN2 (e.g. 5 V) is applied from the second voltage-dividing circuit 15*a* to a source of the fourth transistor 4. As a result, the fourth transistor 4 is maintained in an off state and a potential difference between any terminals does not exceed the withstand voltage (e.g. 3 V).

Further, the divided voltage VN2 (e.g. 5 V) is applied from the second voltage-dividing circuit 15*a* to a drain of the sixth transistor 6, the gate voltage Vg6 (e.g. 2.5 V) is applied from the fourth gate voltage controller 14*a* to the gate of the sixth transistor 6, and a divided voltage VN4 (e.g. 2.5 V) is applied from the second voltage-dividing circuit 15*a* to a source of the sixth transistor 6. As a result, the sixth transistor 6 is maintained in an off state and a potential difference between any terminals does not exceed the withstand voltage (e.g. 3 V).

Further, the divided voltage VN4 (e.g. 2.5 V) is applied from the second voltage-dividing circuit 15*a* to a drain of the third transistor 3, the gate voltage Vg3 (e.g. 0 V) is applied from the third gate voltage controller 13 to the gate of the third transistor 3, and the low voltage (e.g. 0.5 V) inputted to the second input terminal 402 is applied to a source of the third transistor 3. As a result, the third transistor 3 is maintained in an off state and a potential difference between any terminals does not exceed the withstand voltage (e.g. 3 V).

As noted above, in the switching circuit 210 according to Embodiment 3, as compared with the switching circuit 200 according to Embodiment 2, the first circuit 110*a* further includes a fifth transistor 5 connected in series to the first transistor 1 and the second transistor 2 between the first input terminal 401 and the output terminal 400, and the first voltage-dividing circuit 12*a* further divides the first voltage and supplies the first voltage thus divided to a common node N3 between the fifth transistor 5 and the first transistor 1 or the second transistor 2.

This causes the three transistors to be connected in series between the first input terminal 401 and the output terminal 400, thus achieving a switching circuit with a higher withstand voltage that can surely switch between on and off states.

Further, the second circuit 120*a* further includes a sixth transistor 6 connected in series to the third transistor 3 and the fourth transistor 4 between the second input terminal 402 and the output terminal 400, and the second voltage-dividing circuit 15*a* divides the voltage at the output terminal 400 and supplies the voltage thus divided to a common node N4 between the sixth transistor 6 and the third transistor 3 or the fourth transistor 4.

This causes the three transistors to be connected in series between the second input terminal 402 and the output terminal 400, thus achieving a switching circuit with a higher withstand voltage that can surely selectively output two input voltages.

Although, in Embodiment 4, the first circuit 110*a* is provided with three transistors connected in series between the first input terminal 401 and the output terminal 400 and each of the gate voltage controllers (10*a*, 11*a*, and 16) is provided with three transistors connected in series, the number of transistors that are connected in series is not limited to this but may be four or larger. The number needs only be determined as appropriate in consideration of the maximum voltage that is inputted to the switching circuit and the withstand voltage of the transistors so that a voltage that is applied between terminals of each transistor does not exceed the withstand voltage.

Embodiment 4

Figure 7:
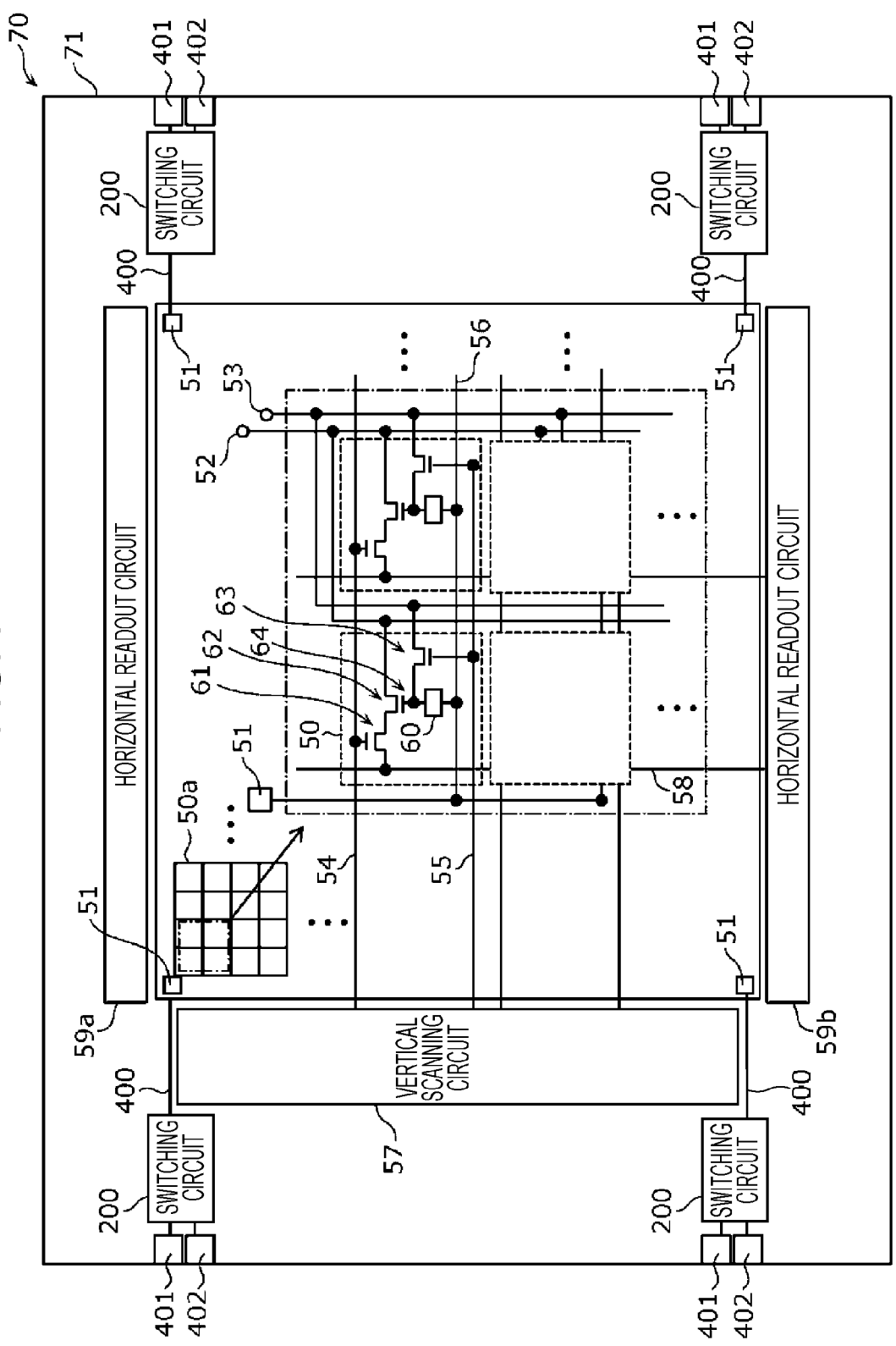
FIG. 7 is a diagram showing an example configuration of an image sensor according to Embodiment 4 mounted with switching circuits according to any of Embodiments 1 to 3.

FIG. 7 is a diagram showing an example configuration of an image sensor 70 serving as an imaging device according to Embodiment 4 mounted with switching circuits according to any of Embodiments 1 to 3 (in Embodiment 4, switching circuits 200 according to Embodiment 2). The image sensor 70 is semiconductor integrated circuit of one chip (image sensor chip) including a semiconductor substrate 71 and circuits (i.e. a pixel array 50*a* including a plurality of pixels 50, two horizontal readout circuits 59*a* and 59*b*, a vertical scanning circuit 57, and four switching circuits 200) located on the semiconductor substrate 71.

Each pixel 50 is composed of a photoelectric converter 60 and a readout circuit (i.e. a circuit constituted by a selection transistor 61, a detection transistor 62, and a reset transistor 63). The photoelectric converter 60 is an element whose sensitivity can vary depending on a voltage that is applied from an outside source, and is for example an organic imaging element. The photoelectric converter 60 has a layer structure in which a photoelectric conversion layer is sandwiched between two electrodes opposed to each other (i.e. an upper electrode serving as an example of a first electrode layer and a lower electrode serving as an example of a second electrode layer). The respective upper electrodes of the pixels 50 form one common electrode layer to which a sensitivity control voltage line 56 is connected. The lower electrode of each pixel 50 is connected to a charge storage node 64 of that pixel. In each pixel 50, a signal generated by the photoelectric converter 60 is stored in the charge storage node 64, and in a pixel whose selection transistor 61 is in an on state, a charge signal is read out by the detection transistor 62, whose drain is connected to a power supply line 52. The charge signal read out from the pixel is read out outward via a vertical signal line 58 and the horizontal readout circuit 59a or 59b. The sensitivity control voltage line 56 is connected via a terminal 51 to the output terminal 400 of a switching circuit 200. The first input terminal 401 and the second input terminal 402 of the switching circuit 200 are provided as external connection terminals of the image sensor chip, and is connected to a voltage generation circuit outside the image sensor chip.

The selection transistor 61 becomes turned on or off in accordance with a control signal that is outputted from the vertical scanning circuit 57 via an address control line 54 for each row. Further, the reset transistor 63 has its drain connected to a reset voltage line 53, and becomes turned on or off in accordance with a control signal that is outputted from the vertical scanning circuit 57 via a reset control line 55 for each row, thereby resetting the charge storage node 64.

In Embodiment 4, as shown in FIG. 7, the image sensor 70 includes four switching circuits 200 according to Embodiment 2, and the switching circuits 200 are located in the four corners, respectively, of the image sensor chip. That is, the semiconductor substrate 71 has a rectangular shape in a plan view. The four switching circuits 200 are located near the four corners, respectively, of the semiconductor substrate 71 in the plan view. The phrase "near the four corners" here means areas close to the four corners, respectively, of the rectangular shape and, more particularly, positions closer to the corners than the middles of the four sides, respectively, of the rectangular shape.

The necessary number of switching circuits 200 is not limited to four but needs only be determined as appropriate according to the pixel array area of the image sensor chip. Further, the switching circuits that the image sensor 70 includes are not limited to switching circuits 200 according to Embodiment 2 but may be switching circuits 100 according to Embodiment 1, switching circuits 210 according to Embodiment 3, or a mixture of switching circuits according to Embodiments 1 to 3.

Figure 8:
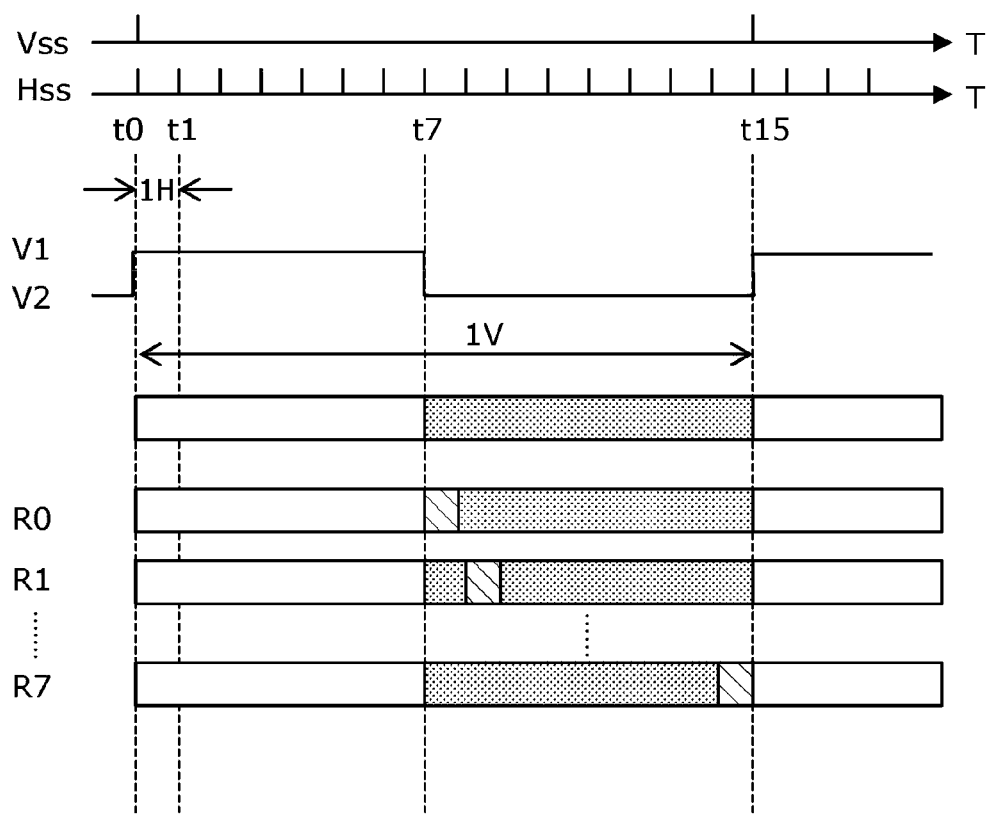
FIG. 8 is a timing chart showing an example operation of the image sensor shown in FIG. 7.

FIG. 8 is a timing chart showing an example operation of the image sensor 70 shown in FIG. 7. The timing chart here shows switching control exercised by using the switching circuits 200 and a relationship between exposure and readout of the image sensor chip. In FIG. 8, Vss represents timings of falling edges (or rising edges) of a vertical synchronizing signal, and Hss represents timings of falling edges (or rising edges) of a horizontal synchronizing signal. The waveform whose H level is indicated by V1 and whose L level is indicated by V2 represents a voltage that is applied from the switching circuits 200 to the upper electrodes of the photoelectric converters 60. The belt-shaped charts indicate states of exposure in each separate row of the pixel array 50a. For the sake of ease, the following describes an example operation in which the pixel array 50a is constituted by eight rows (R0 to R7) of pixels 50.

With attention focused, for example, on the row R0 in FIG. 8, the white rectangle, the gray (dot pattern) rectangle, and the diagonally shaded rectangle represent an exposure period, a non-exposure period, and a pixel readout period, respectively. It is assumed here that the photoelectric converters 60 have such characteristics as to exhibit high photoelectric conversion sensitivity in a case where a high voltage is applied to the upper electrodes and exhibit low photoelectric conversion sensitivity in a case where a low voltage is applied to the upper electrodes. Specifically, it is assumed that when V1=7 V, photoelectric conversions are carried out and when V2=0.5 V, there is a decrease in photoelectric conversion sensitivity and almost no photoelectric conversions take place.

A period from a point of time t0 to a point of time t1 is called "1H period", which represents a period from selection of a certain row to selection of the next row, and a period of t0 to t15 from selection of a certain row to the time when the row is read out again is called "1V period". In the example shown in FIG. 8, the 1V period is equivalent to one frame. During the 1V period, the image sensor 70 carries out exposure plus pixel signal readout. For example, during a period from t0 to t7, the high voltage V1 is applied to the photoelectric converters 60. At this point in time, the photoelectric converters 60 output signal charges proportional to the amounts of light that fell on the pixels. Next, during a period from t7 to t15, the low voltage V2 is applied to the photoelectric converters 60. At this point in time, the photoelectric converters 60 carry out almost no photoelectric conversions, so that there is no change in voltage of the charge storage node 64 of each pixel 50. That is, the period from t0 to t7 is an exposure period, and the period from t7 to t15 is an exposure stoppage period, so that exposure of the whole pixel array 50a covered with the photoelectric converters 60 can be controlled. It is possible to read out the rows R0 to R7 in sequence during the exposure stoppage period, and this function is equivalent to a global shutter. Use of switching circuits 200 of the present disclosure makes it possible to, without providing switching circuits outside or using high-withstand-voltage transistors in an image sensor chip, achieve an image sensor 70 that switches the sensitivity characteristics of the photoelectric converters 60.

As noted above, an image sensor 70 according to Embodiment 4 includes a semiconductor substrate 71, a pixel array 50a including a plurality of pixels 50 disposed on the semiconductor substrate 71, and a switching circuit 200 located on the semiconductor substrate 71. Each of the plurality of pixels 50 includes a photoelectric converter 60 including a first electrode layer, a second electrode layer, and a photoelectric conversion layer sandwiched between the first electrode layer and the second electrode layer. The respective first electrode layers of the plurality of pixels 50 form one common electrode layer. The output terminal 400 of the switching circuit 200 is connected to the common electrode layer.

As a result of this, a highly-reliable switching circuit that outputs a high voltage using low-withstand-voltage transistors applies an output voltage to the common electrode layer. This achieves a highly-reliable image sensor 70 that can change the sensitivity of photoelectric conversions depending on a voltage that is applied to the photoelectric converters 60.

Further, the image sensor 70 includes a plurality of the switching circuits 200, and the respective output terminals 400 of the plurality of switching circuits 200 are connected to the common electrode layer. For example, the image sensor 70 includes four switching circuits 200. The semiconductor substrate 71 has a rectangular shape in a plan view. The four switching circuits 200 are located near the four corners, respectively, of the semiconductor substrate 71 in the plan view.

As a result of this, voltages are supplied from the switching circuits to the four places in the common electrode layer. This reduces a drop in voltage in the common electrode layer and reduces variations in value and timing of voltages that are applied to the respective photoelectric converters 60 of the pixels 50. This achieves a highly-reliable image sensor 70.

While the switching circuits according to Embodiments 1 to 3 of the present disclosure and the imaging device according to Embodiment 4 of the present disclosure have been described above, the present disclosure is not limited to these embodiments. An embodiment obtained by applying, to any of the embodiments, any of various types of modification that persons skilled in the art conceive of and another embodiment constructed by a combination of some constituent elements according to the embodiments are encompassed in the scope of the present disclosure without departing from the spirit of the present disclosure.

While Embodiments 1 to 3 have illustrated configurations in which resistor elements are used to generate a divided potential, there may be a configuration in which a divided potential is generated by controls other than resistor elements.

Further, while, in Embodiments 1 to 3, the first circuits 110 and 110a are each constituted by two or more PMOS transistors connected in series and the second circuits 120 and 120a are each constituted by two or more NMOS transistors connected in series, they may be constituted by CMOS switches using both PMOS and NMOS, depending on input voltages.

Further, the bias voltage generation circuits 500, 500a, and 502 may output voltages obtained by dividing a voltage inputted to the first input terminal 401, or may separately output a voltage inside or outside the SoC.

Further, the numbers used in the description of Embodiments 1 to 4 are all taken as examples to specifically describe the present disclosure, and the present disclosure is not restricted by the numbers taken as examples.

Further, the elements serving as the constituent elements described above are all taken as examples to specifically describe the present disclosure, and the present disclosure is not limited to the elements taken as examples. Further, the relationships of connection between constituent elements are taken as examples to specifically describe the present disclosure, and these relationships of connection are not the only relationships of connection that achieve the functions of the present disclosure.

A switching circuit according to the present disclosure has such characteristics as to control a high voltage while ensuring reliability using low-withstand-voltage transistors, and is useful as a switching circuit that selectively outputs a plurality of voltages. Further, the switching circuit can also be applied to a voltage control switch of an image sensor that requires such high-voltage control as to vary sensitivity by applying a potential to a photoelectric conversion layer. An imaging device according to the present disclosure can be utilized as a highly-reliable image sensor, e.g. as an organic image sensor, that can change the sensitivity of photoelectric conversions depending on a voltage that is applied to the photoelectric converters.

What is claimed is:

1. A switching circuit comprising:
   a first input terminal;
   an output terminal; and
   a first circuit that switches between outputting and not outputting, to the output terminal, a first voltage that is inputted to the first input terminal,
   wherein the first circuit includes:
     a first terminal,
     a first transistor and a second transistor that are connected in series between the first input terminal and the output terminal, and
     a first voltage-dividing circuit that is connected between the first input terminal and the first terminal, and that generates a first divided voltage by dividing a potential difference between the first input terminal and the first terminal to supply the first divided voltage to a first node between the first transistor and the second transistor, and
   wherein the first terminal is not located on any electrical path through which a current flows between the first input terminal and the output terminal.

2. The switching circuit according to claim 1, further comprising:
   a second input terminal; and
   a second circuit that switches between outputting and not outputting, to the output terminal, a second voltage that is inputted to the second input terminal,
   wherein the second circuit includes:
     a second terminal,
     a third transistor and a fourth transistor that are connected in series between the second input terminal and the output terminal, and
     a second voltage-dividing circuit that is connected between the output terminal and the second terminal, and that generates a second divided voltage by dividing a potential difference between the output terminal and the second terminal to supply the second divided voltage to a second node between the third transistor and the fourth transistor.

3. The switching circuit according to claim 1, wherein the first voltage-dividing circuit includes a first resistor element and a second resistor element that are connected in series between the first input terminal and the first terminal, and
   a point of connection between the first resistor element and the second resistor element is connected to the first node.

4. The switching circuit according to claim 2, wherein the second voltage-dividing circuit includes a first resistor element and a second resistor element that are connected in series between the output terminal and the second terminal, and
   a point of connection between the first resistor element and the second resistor element is connected to the second node.

5. The switching circuit according to claim 2, wherein the first voltage is a voltage exceeding at least one of a maximum voltage rating of the first transistor and a maximum voltage rating of the second transistor, the second voltage is a voltage not exceeding either a maximum voltage rating of the third transistor or a maximum voltage rating of the fourth transistor, and the output terminal outputs the first voltage during a first period and outputs the second voltage during a second period that is different from the first period.

6. The switching circuit according to claim 1, wherein the first circuit further includes a third transistor connected in series to the first transistor and the second transistor between the first input terminal and the output terminal, and the first voltage-dividing circuit further generates a second divided voltage by dividing the potential difference between the first input terminal and the first terminal to supply the second divided voltage to a second node between the third transistor and the first transistor or the second transistor.

7. The switching circuit according to claim 2, wherein the second circuit further includes a fifth transistor connected in series to the third transistor and the fourth transistor between the second input terminal and the output terminal, and the second voltage-dividing circuit further generates a third divided voltage by dividing the potential difference between the output terminal and the second terminal to supply the third divided voltage to a third node between the fifth transistor and the third transistor or the fourth transistor.

8. An imaging device comprising:
a semiconductor substrate;
a pixel array including a plurality of pixels arrayed on the semiconductor substrate; and
a switching circuit according to claim 1 located on the semiconductor substrate,
wherein each of the plurality of pixels includes a first electrode, a second electrode, and a photoelectric conversion layer sandwiched between the first electrode and the second electrode,
the respective first electrodes of the plurality of pixels are electrically connected to one another, and
the output terminal of the switching circuit is connected to the first electrode of each of the plurality of pixels.

9. The imaging device according to claim 8, wherein the switching circuit comprises a plurality of switching circuits, and
the output terminal of each of the plurality of switching circuits is connected to the first electrode.

10. The imaging device according to claim 8, wherein the switching circuit comprises four switching circuits, the semiconductor substrate has a rectangular shape in a plan view, and
the four switching circuits are located adjacent four corners, respectively, on the semiconductor substrate in the plan view.

11. The switching circuit according to claim 2, wherein the first voltage-dividing circuit includes a first resistor element and a second resistor element that are connected in series between the first input terminal and the first terminal,
a point of connection between the first resistor element and the second resistor element is connected to the first node,
the second voltage-dividing circuit includes a third resistor element and a fourth resistor element that are connected in series between the output terminal and the second terminal, and a point of connection between the third resistor element and the fourth resistor element is connected to the second node.

12. The switching circuit according to claim 2, wherein the first circuit further includes a fifth transistor connected in series to the first transistor and the second transistor between the first input terminal and the output terminal, the first voltage-dividing circuit further generates a third divided voltage by dividing the potential difference between the first input terminal and the first terminal to supply the third divided voltage to a third node between the fifth transistor and the first transistor or the second transistor, the second circuit further includes a sixth transistor connected in series to the third transistor and the fourth transistor between the second input terminal and the output terminal, and the second voltage-dividing circuit further generates a fourth voltage by dividing the potential difference between the output terminal and the second terminal to supply the fourth divided voltage to a fourth node between the sixth transistor and the third transistor or the fourth transistor.

13. The switching circuit according to claim 2, wherein the second terminal is not located on any electrical path through which a current flows between the output terminal and the second input terminal.

14. The switching circuit according to claim 1, wherein the first terminal is maintained at a reference voltage.

15. The switching circuit according to claim 14, wherein the reference voltage is constant.

16. The switching circuit according to claim 14, wherein the reference voltage is a ground voltage.

17. The switching circuit according to claim 1, wherein the first voltage-dividing circuit is configured such that no current flows between the first input terminal and the output terminal via the first terminal.

18. The switching circuit according to claim 1, wherein a potential of the first terminal is constant.

19. An imaging device comprising:
a semiconductor substrate;
a pixel array including a plurality of pixels arrayed on the semiconductor substrate; and
a switching circuit located on the semiconductor substrate,
the switching circuit including:
a first input terminal;
an output terminal; and
a first circuit that switches between outputting and not outputting, to the output terminal, a first voltage that is inputted to the first input terminal,
wherein the first circuit includes:
a first transistor and a second transistor that are connected in series between the first input terminal and the output terminal, and
a first voltage-dividing circuit that divides the first voltage to supply a first divided voltage to a first node between the first transistor and the second transistor, and
wherein each of the plurality of pixels includes a first electrode, a second electrode, and a photoelectric conversion layer sandwiched between the first electrode and the second electrode,
the respective first electrodes of the plurality of pixels are electrically connected to one another, and
the output terminal of the switching circuit is connected to the first electrode of each of the plurality of pixels.

20. An imaging device comprising:
a semiconductor substrate;
a pixel array including a plurality of pixels arrayed on the semiconductor substrate; and
a switching circuit, wherein
the switching circuit includes:
   a first input terminal;
   an output terminal; and
   a first circuit that switches between outputting and not outputting, to the output terminal, a first voltage that is inputted to the first input terminal,
the first circuit includes;
   a first terminal,
   a first transistor and a second transistor that are connected in series between the first input terminal and the output terminal; and
   a first voltage-dividing circuit that is connected between the first input terminal and the first terminal, and that generates a first divided voltage by dividing a potential difference between the first input terminal and the first terminal to supply the first divided voltage to a first node between the first transistor and the second transistor, and
the output terminal of the switching circuit is connected to at least one of the plurality of pixels.

21. The imaging device according to claim 20, wherein the switching circuit is located on the semiconductor substrate.

\* \* \* \* \*